United States Patent
Alhabshi et al.

(10) Patent No.: US 12,382,748 B2
(45) Date of Patent: Aug. 5, 2025

(54) NANOSTRUCTURES TO REDUCE OPTICAL LOSSES

(71) Applicant: Saudi Arabian Oil Company, Dhahran (SA)

(72) Inventors: Esra Alhabshi, Thuwal (SA); Konstantinos Kotsovos, Thuwal (SA)

(73) Assignee: Saudi Arabian Oil Company, Dhahran (SA)

( * ) Notice: Subject to any disclaimer, the term of this patent is extended or adjusted under 35 U.S.C. 154(b) by 201 days.

(21) Appl. No.: 17/166,317

(22) Filed: Feb. 3, 2021

(65) Prior Publication Data
US 2022/0216352 A1    Jul. 7, 2022

(30) Foreign Application Priority Data
Jan. 4, 2021  (GR) ............... 20210100005

(51) Int. Cl.
| | | |
|---|---|---|
| G02F 1/1335 | (2006.01) | |
| C23C 14/04 | (2006.01) | |
| H10F 77/30 | (2025.01) | |
| C23C 14/06 | (2006.01) | |
| G02B 1/118 | (2015.01) | |
| H02S 40/22 | (2014.01) | |

(52) U.S. Cl.
CPC ......... H10F 77/315 (2025.01); C23C 14/042 (2013.01); C23C 14/0652 (2013.01); G02B 1/118 (2013.01); G02F 1/133502 (2013.01); H02S 40/22 (2014.12)

(58) Field of Classification Search
CPC ............. H01L 31/02168; C23C 14/042; G02F 1/133502
USPC ......................................... 427/248.1
See application file for complete search history.

(56) References Cited

U.S. PATENT DOCUMENTS

| | | | | |
|---|---|---|---|---|
| 4,511,600 | A * | 4/1985 | Leas | H10F 71/121 |
| | | | | 427/75 |
| 9,126,392 | B1 * | 9/2015 | Nielson | H10F 19/40 |
| 9,530,636 | B2 * | 12/2016 | Oh | H01J 65/00 |
| 10,280,506 | B2 | 5/2019 | Benvenuti et al. | |
| 10,644,174 | B2 * | 5/2020 | Dutta | H10F 77/488 |
| 11,467,495 | B2 * | 10/2022 | Cordaro | G03F 7/0002 |
| 2009/0110896 | A1 * | 4/2009 | Kuramachi | H10K 50/8445 |
| | | | | 428/220 |
| 2010/0195204 | A1 | 8/2010 | Walker | |

(Continued)

FOREIGN PATENT DOCUMENTS

| | | |
|---|---|---|
| CN | 110890431 | 3/2020 |
| EP | 3093692 | 11/2016 |

(Continued)

OTHER PUBLICATIONS

Barborini et al., "Cluster beam microfabrication of patterns of three-dimensional nanostructured objects." Applied Physics Letters 77.7, Aug. 200, 1059-1061, 3 pages.

(Continued)

*Primary Examiner* — Brian K Talbot
(74) *Attorney, Agent, or Firm* — Fish & Richardson P.C.

(57) ABSTRACT

Methods and systems for creating nanostructures to reduce optical losses are provided. An example described herein provides a solar cell. The solar cell includes an antireflective coating including sloped nanostructures formed in a vapor deposition process.

11 Claims, 8 Drawing Sheets

(56) References Cited

U.S. PATENT DOCUMENTS

| | | | |
|---|---|---|---|
| 2010/0259823 A1* | 10/2010 | Xi | G02B 1/118 |
| | | | 216/13 |
| 2012/0152346 A1 | 6/2012 | Yang et al. | |
| 2014/0007937 A1* | 1/2014 | Maeda | H10F 77/211 |
| | | | 252/514 |
| 2014/0373905 A1* | 12/2014 | Cornfeld | H10F 71/139 |
| | | | 136/255 |
| 2015/0060742 A1* | 3/2015 | Glicksman | C03C 3/122 |
| | | | 252/514 |
| 2017/0236953 A1* | 8/2017 | Dutta | H01L 31/0547 |
| | | | 136/256 |
| 2018/0130921 A1* | 5/2018 | Mayer | H01L 31/02168 |
| 2018/0277691 A1* | 9/2018 | Kärkkäinen | H10K 30/82 |
| 2019/0081195 A1* | 3/2019 | Pranov | G02B 19/0023 |
| 2019/0305165 A1* | 10/2019 | Bujard | H01L 31/18 |
| 2022/0190649 A1* | 6/2022 | Alpert | H02J 50/30 |
| 2023/0080947 A1* | 3/2023 | Blakely | H01L 33/486 |
| | | | 257/98 |
| 2023/0292612 A1* | 9/2023 | Song | H10K 85/615 |

FOREIGN PATENT DOCUMENTS

| | | | | |
|---|---|---|---|---|
| WO | WO-2012057707 A1 * | 5/2012 | | G01J 3/0205 |
| WO | WO-2019075215 A1 * | 4/2019 | | |

OTHER PUBLICATIONS

Yesilkoy et al., "3D nanostructures fabricated by advanced stencil lithography." Nanoscale 8.9, 2016, 4945-4950, 5 pages.

PCT International Search Report and Written Opinion in International Appln. No. PCT/US2022/011201, dated Apr. 8, 2022, 16 pages.

Fan et al., "Reducing reflection losses in solar cells" SPIE Newsroom Dec. 2016, 3 pages.

Kolbel et al., "Shadow-Mask Evaporation through Monolayer-Modified Nanostencils" NANO Letters vol. 2, No. 12, 2002, 1339-1343, 5 pages.

Lishchynska et al., "Predicting mask distortion, clogging and pattern transfer for stencil lithography" Microelectronic Engineering 84, 2007, 42-53, 12 pages.

* cited by examiner

NANOSTRUCTURES TO REDUCE OPTICAL LOSSES

CROSS REFERENCE TO RELATED APPLICATIONS

This application claims priority under 35 U.S.C. § 119(a) on Patent Application No. 20210100005, filed in Greece on Jan. 4, 2021, the entire disclosure of which is incorporated herein by reference.

TECHNICAL FIELD

The present disclosure is directed to reducing reflective light losses on the top surface of solar cells.

BACKGROUND

Optical losses in solar cells have a significant impact on the electrical performance of solar cells. Top surface reflective optical losses have a remarkable impact on the absorption spectrum of the solar cell and as a result on the photo generated current output. Reducing reflective losses in planar solar cells can be achieved through chemical top surface etching. However, chemical etching is challenging for some materials used in solar cell, such as solution processed materials. Physical texturing of the top surface has been proposed as a solution. However, physical texturing may be uneconomical and not scalable.

SUMMARY

An embodiment disclosed in examples herein provides a method for fabricating sloped nanostructures on a surface of a substrate. The method includes placing a mask over the substrate, placing substrate with the mask in a deposition chamber, vaporizing material for deposition, and allowing clogging of openings in the mask during the deposition to form sloped shapes.

Another embodiment described in examples herein provides a solar cell. The solar cell includes an antireflective coating including sloped nanostructures formed in a vapor deposition process.

DETAILED DESCRIPTION

As described herein, some types of solar cells are difficult to form with textured surfaces, such as solution processed solar cells. Embodiments described in examples herein provide a technique of fabricating three dimensional structures, termed sloped nanostructures, over a top surface of a solar cell to increase internal reflections and, thus, total absorption by the solar cell. A highly transparent and sloped three dimensional structure is patterned on the top surface of planar solar cells through projected physical evaporation.

Figure 1A:
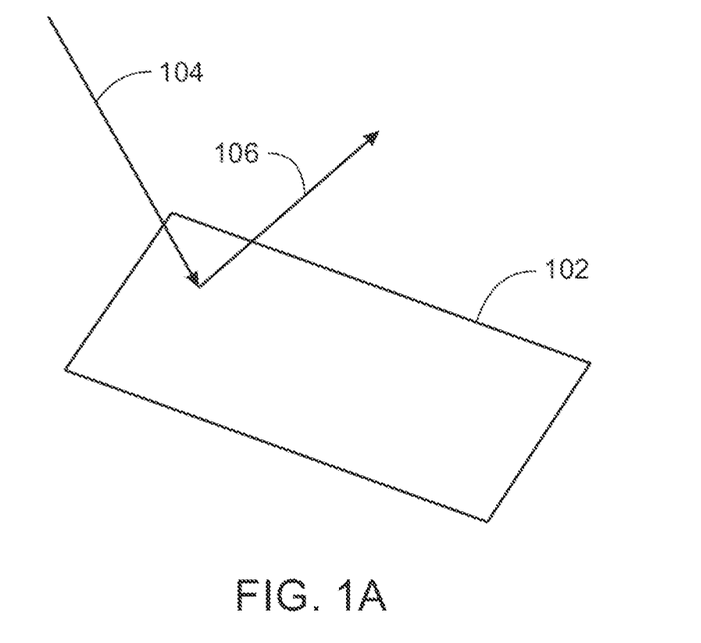
FIGS. 1A and 1B are schematic drawings of light reflecting from solar cells that are uncoated and coated with the sloped nanostructures described herein.
Figure 1B:
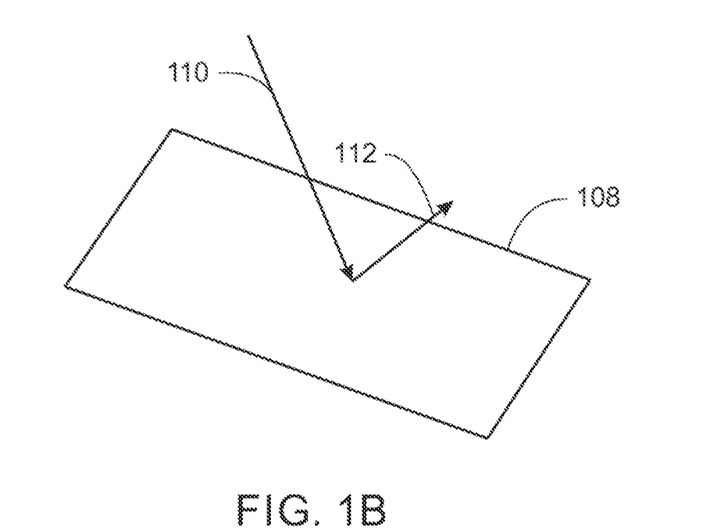

FIGS. 1A and 1B are schematic drawings of light reflecting from solar cells that are uncoated and coated with the sloped nanostructures described herein. FIG. 1A shows a solar cell 102, for example, formed by a solution process technique, which does not have the antireflection structures described herein. An incident light ray 104 hits the surface of the solar cell 102, and a portion of the photons are reflected away in a reflected light ray 106. In the schematic drawings of FIGS. 1A and 1B, the relative length of the reflected light ray 106 to the incident light ray 104 are used to provide a general indication of the number of photons that are reflected from the surface of the solar cells 102 and 108.

FIG. 1B shows a solar cell 108 that has the antireflection structures described herein formed on the surface. In this example, an incident light ray 110 is reflected from the surface of the solar cell 108, forming a reflected light ray 112 that includes fewer photons than the incident light ray 106 impacting the smooth surface.

Figure 2:
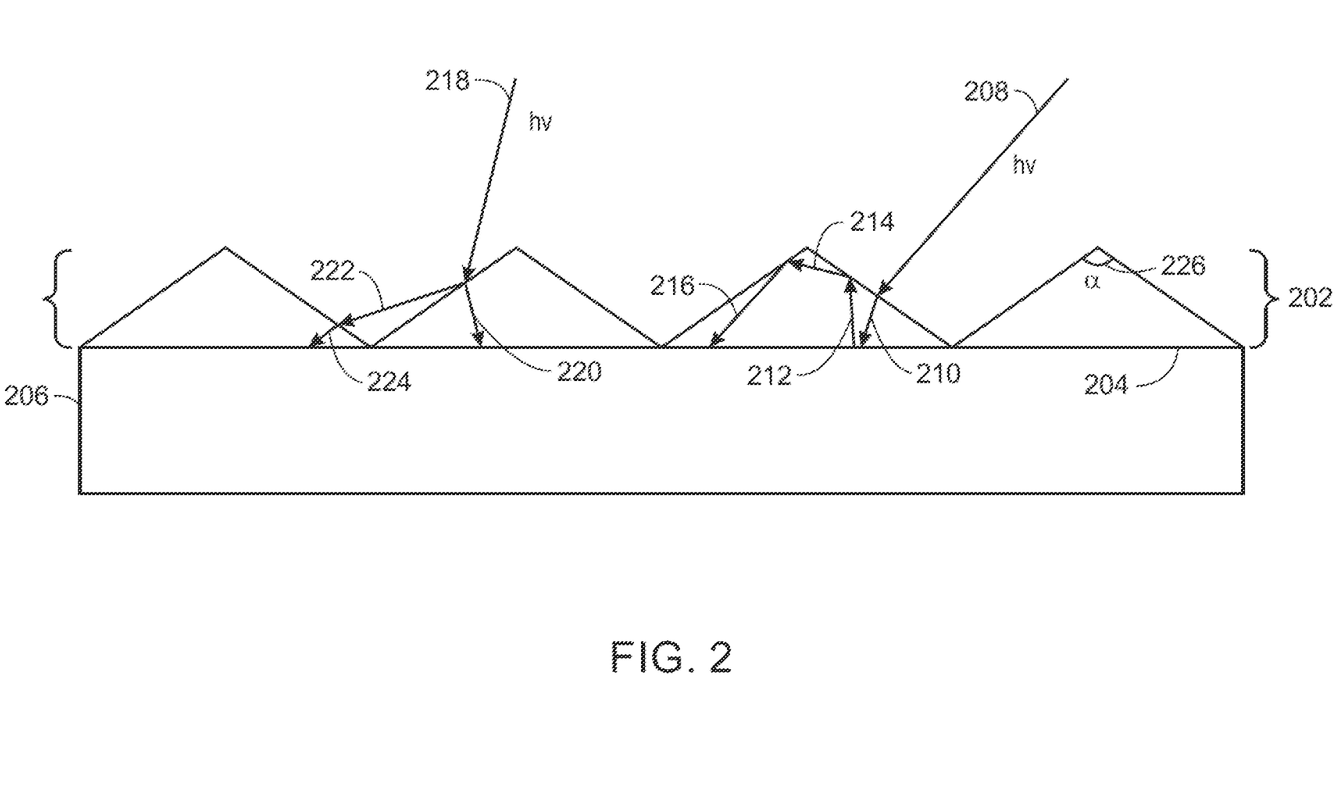
FIG. 2 is a schematic drawing of light transmitted through a structural coating of sloped shapes to the surface of an underlying solar cell.

FIG. 2 is a schematic drawing of light transmitted through a structural coating 202 of sloped shapes to the surface 204 of an underlying solar cell 206. Light projected on the solar cell is mostly transported through the structural coating 202 to the active layers of the solar cell 206. The structure coating 202 is selected to be highly transparent material that has the same or higher transmission spectrum of the material forming the surface 204 of the solar cell 206. Further, the transparent material may be selected to have a refractive index similar to the surface 204 of the solar cell 206, and a transmittance spectrum similar or higher than the materials used to encapsulate the solar cell, which is often glass. In some embodiments, the evaporated material used for the structural coating 202 is silicon nitride. Silicon nitride is a highly transparent material that matches the transmittance spectrum of glass, which is often used as a top surface in the encapsulation of solution processed solar cells, e.g., over the structure coating 202.

The structural coating 202 increases the total internal reflectance over the surface 204, reducing interlayer refractive reflection losses. For example, a light ray 208 impinging on 1 of the structures is transmitted 210 towards the surface 204 of the solar cell 206. In some cases, part of the light ray may be reflected 212 back from the surface 204, for example, due to the incident angle or the refractive index mismatch of the different layers of the solar cell 206. Therefore, it is highly advisable to match refractive index of the structural coating 202 to the solar cell 206. The angled surface of the structure allows the reflected 212 light to impinge on the surface of the structure at a low angle causing an internal reflection 214. The light ray reflected off the surface by internal reflection 214 impinges on another surface of the structure and is directed towards the surface by a second internal reflection 216, and is then absorbed by the solar cell 206. As another example, a second light ray 218 impinges on the surface of a structure at an oblique angle. A portion 220 of the light ray 218 is directed towards the surface 204 of the solar cell 206 where it is absorbed. Another portion 222 of the light ray 218 is reflected off the surface of the structure, impinging on a second structure. At the second structure, the portion 222 of the light ray 218 is transmitted 224 towards the surface 204 of the solar cell 206, where it is absorbed. Accordingly, the deposition of the nanostructures reduces the light reflecting from the surface 204 of the solar cell 206. As described with respect to FIGS. 5 and 6 the structures may be conical pyramids or square pyramids, depending on the mask chosen to form the structures.

As the antireflection properties of the structural coating 202 is based on total internal reflectance, the properties may be adjusted by changing the angle 226 of the structures. This may be used, for example, to adjust the efficiency of the structural coating 202 to match the expected range of angles of light impinging on the solar cell 206.

Figure 3:
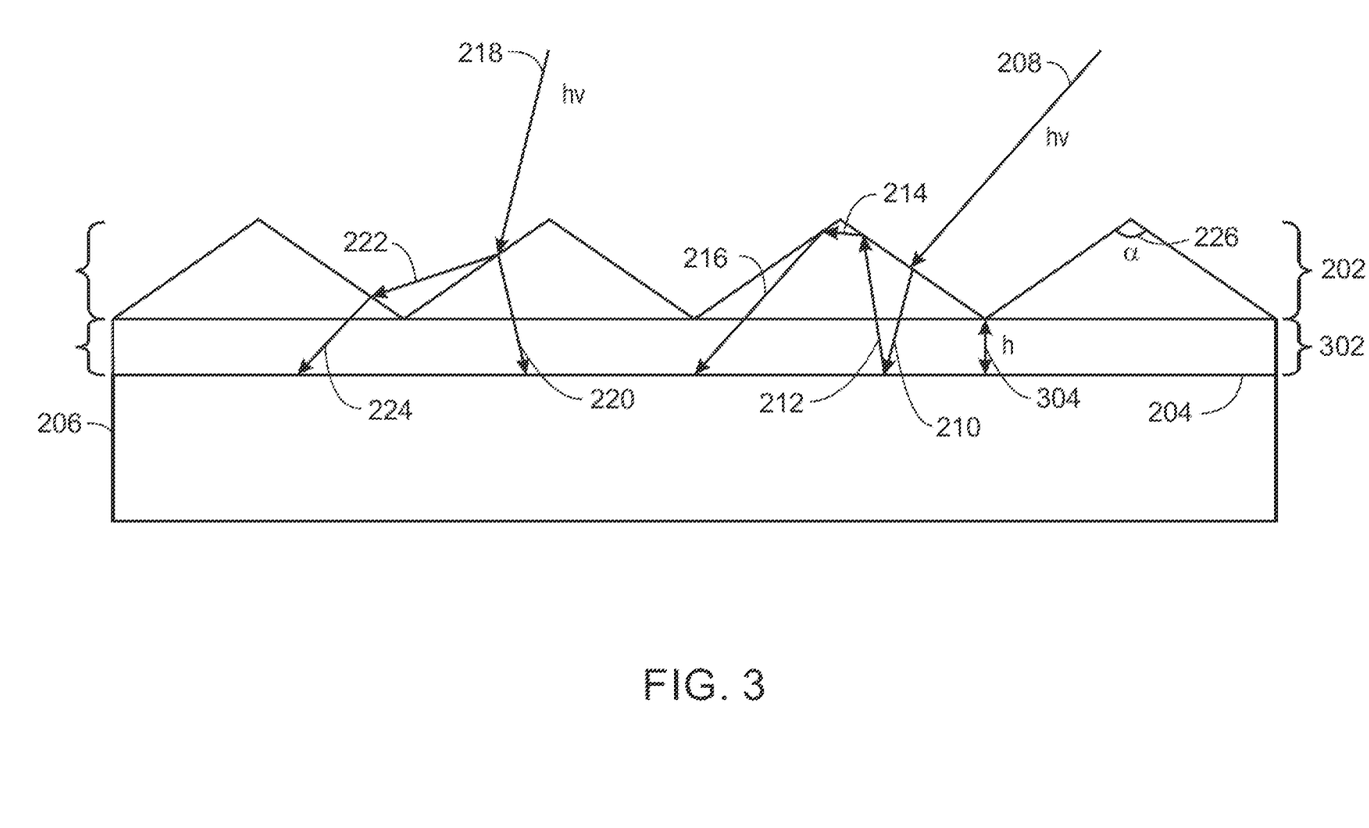
FIG. 3 is a schematic drawing of light transmitted through a structural coating of sloped shapes wherein each of the shapes overlaps to form a base layer over the solar cell.

FIG. 3 is a schematic drawing of light transmitted through a structural coating of sloped shapes wherein each of the shapes overlaps to form a base layer 302 over the solar cell. Like numbered items are as described with respect to FIG. 2. As described herein, the process to form the shapes may be adjusted, for example, depending on such factors as the expected range of angles for the radiation to the solar cell, the materials of the solar cell, and the like. In the example of FIG. 3, each of the shapes overlap, creating a base layer 302 that is offset from the surface 204 of the solar cell 206. The height 304 of the base layer 302 may be adjusted by the amount of overlap. Increasing the height 304 of the base layer 302 may be used to adjust the amount of total internal reflectance, for example, based on the expected range of angles for the radiation impinging on the solar cell.

Figure 4A:
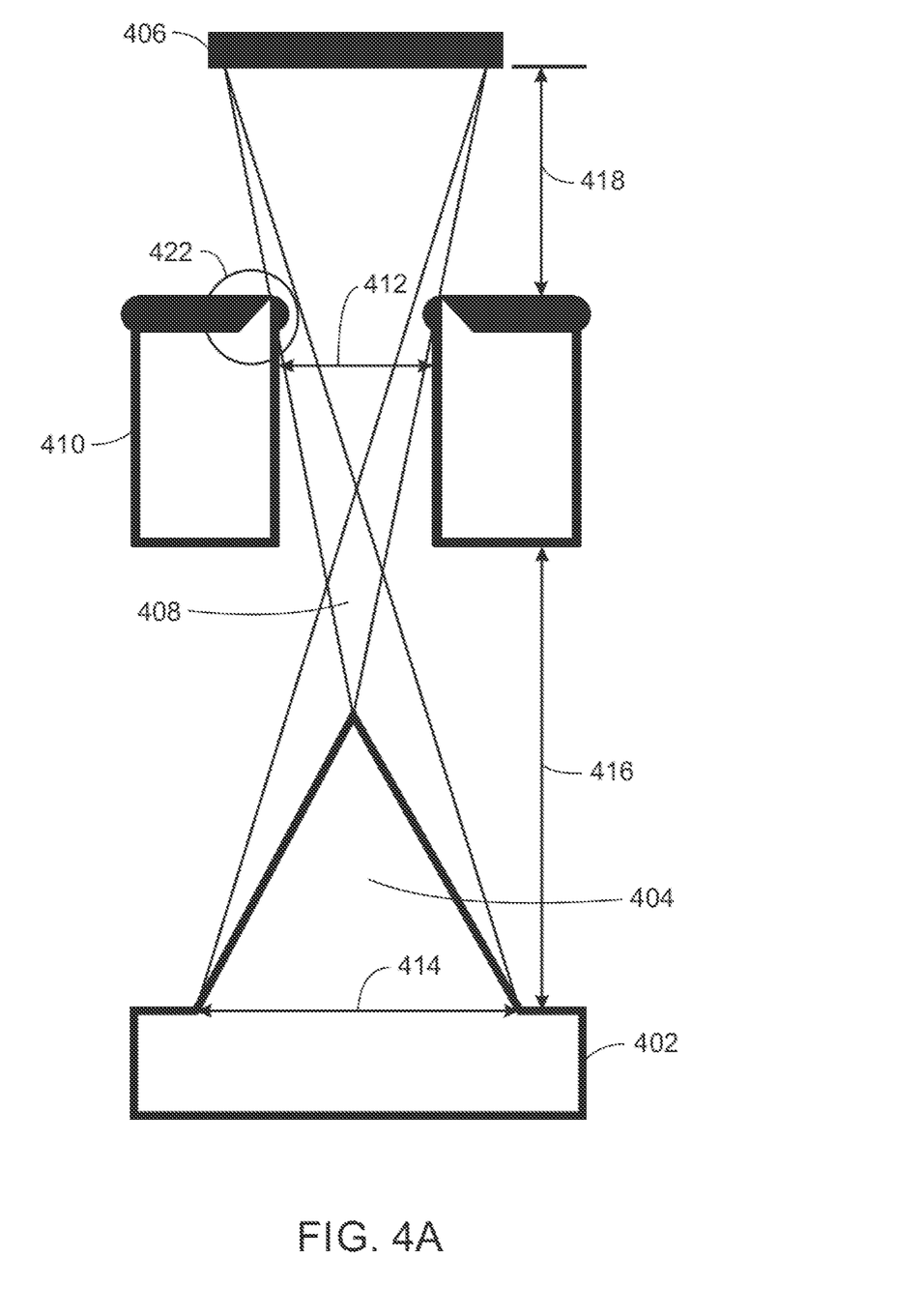
FIGS. 4A and 4B are schematic diagrams of projected evaporation onto a substrate to form a sloped nanostructures.
Figure 4B:
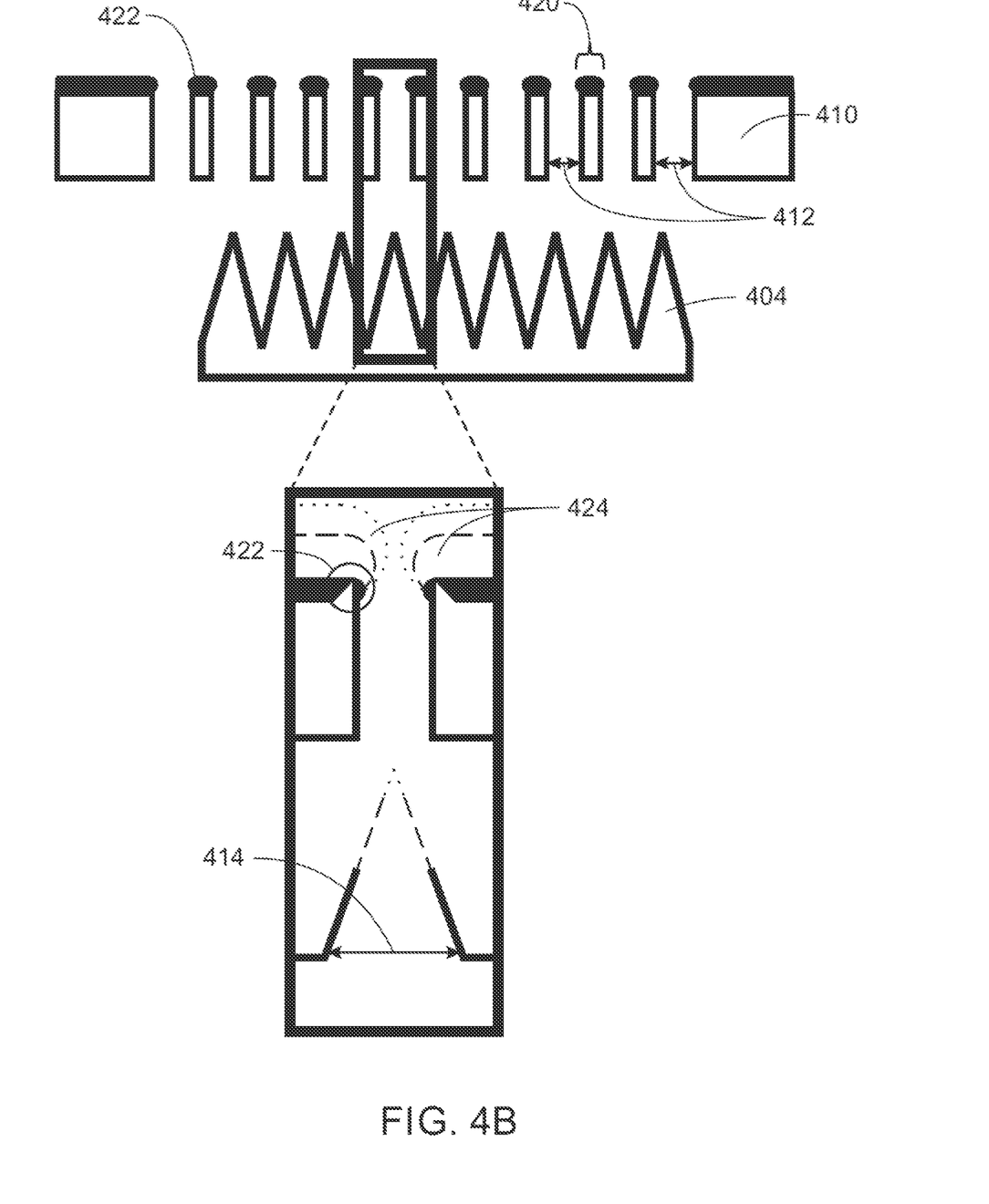

FIGS. 4A and 4B are schematic diagrams of projected evaporation onto a substrate 402 to form a sloped nanostructures 404. As described herein the substrate 402 in some embodiments the substrate is a solar cell. In the projected evaporation process, material is evaporated from an evaporation source 406. The evaporated material 408 passes through a mask 410 that comprises nanoscale openings 412. The evaporated material 408 is directed at a deposition spot 414 that is directly below one of the nanoscale openings 412, may be about the same size as the nanoscale opening 412 at the beginning of the process, decreasing as the nozzle clogs. The mask 410 is positioned at a distance 416 from the deposition spot 414, which results in uneven deposition of the evaporated material 408, e.g., higher at the center and lower at the sides of the deposition spot 414.

The evaporated material 408 is also deposited on the mask 410 and at the edges of the nanoscale openings 412 in the mask 410. Together with the migration effect the deposition of material at the edges of the nanoscale openings 412 slowly clogs the nanoscale openings 412 of the mask 410. As the evaporative deposition proceeds, the clogging increases, which reduces the size of the nanoscale openings 412 in the mask 410, and thus reduces the size of the deposition spot 414. The resulting evaporated structure is a sloped nanostructure, such as a conical shape or a pyramidal shape, among others.

The distance 418 between the evaporation source 406 and the mask 410, and the size of the evaporation source 406 determines the angle 226 (FIG. 2) of the wall and the size of the base of the sloped nanostructure 404. For example, as the distance 418 between the evaporation source 406 and the mask 410 is decreased, the base of the sloped nanostructure 404 and the angle 226 are increased, e.g., the sloped nanostructure 404 has less steep walls. The distance 418 is tuned to control the parameters of the sloped nanostructure 404, for example, so that the angle 226 of the wall of the sloped nanostructure 404 is not large. The distance 420 between the nanoscale openings 412 on the mask 410 is generally selected to be equal to or less than the nanoscale openings 412, for example, less than about 500 nm to ensure full surface deposition. This may be used to prevent gaps between sloped nanostructures 404. However, the distance may be increased to change the shape of the sloped nanostructures 404. A larger distance 416 increases the width of the area of projected evaporation and the size of the base of the sloped structure 414. The evaporation rate, the distance 416 between the mask 410 and the deposition spot 414, and the size of the nanoscale openings 412 in the mask 410 determines the height of the sloped nanostructure 404. In some embodiments, the distance 416 is between about 1 µm and about 2 µm. This distance 416 promotes the formation of a thin structural coating 202 (FIG. 2) and is far enough to protect the tip of the sloped nanostructure 404 from being damaged by the mask 410, for example, as the mask 410 is removed.

The mask opening 412 could be made smaller or larger depending on the desired base area 414 of the sloped structure 404 and its height. In various embodiments, the openings are between about 100 nm and about 10 µm. In some embodiments, the size of the nanoscale openings 412 is about 500 nm. A narrow opening results in a short and small sloped structures, and a wide opening results in a large sloped structures.

The use of the clogging affect to form the sloped nanostructures is shown in FIG. 4B. To promote the start of the clogging, in some embodiments, the design of the mask 410 includes edges 422 of the nanoscale openings 412 that are higher than the rest of the mask 410. Creating tip-shaped corners at the nanoscale openings 412 promotes migration and the formation of clogging 424. The clogging 424 is used to create the sloped nanostructures 404.

Figure 5:
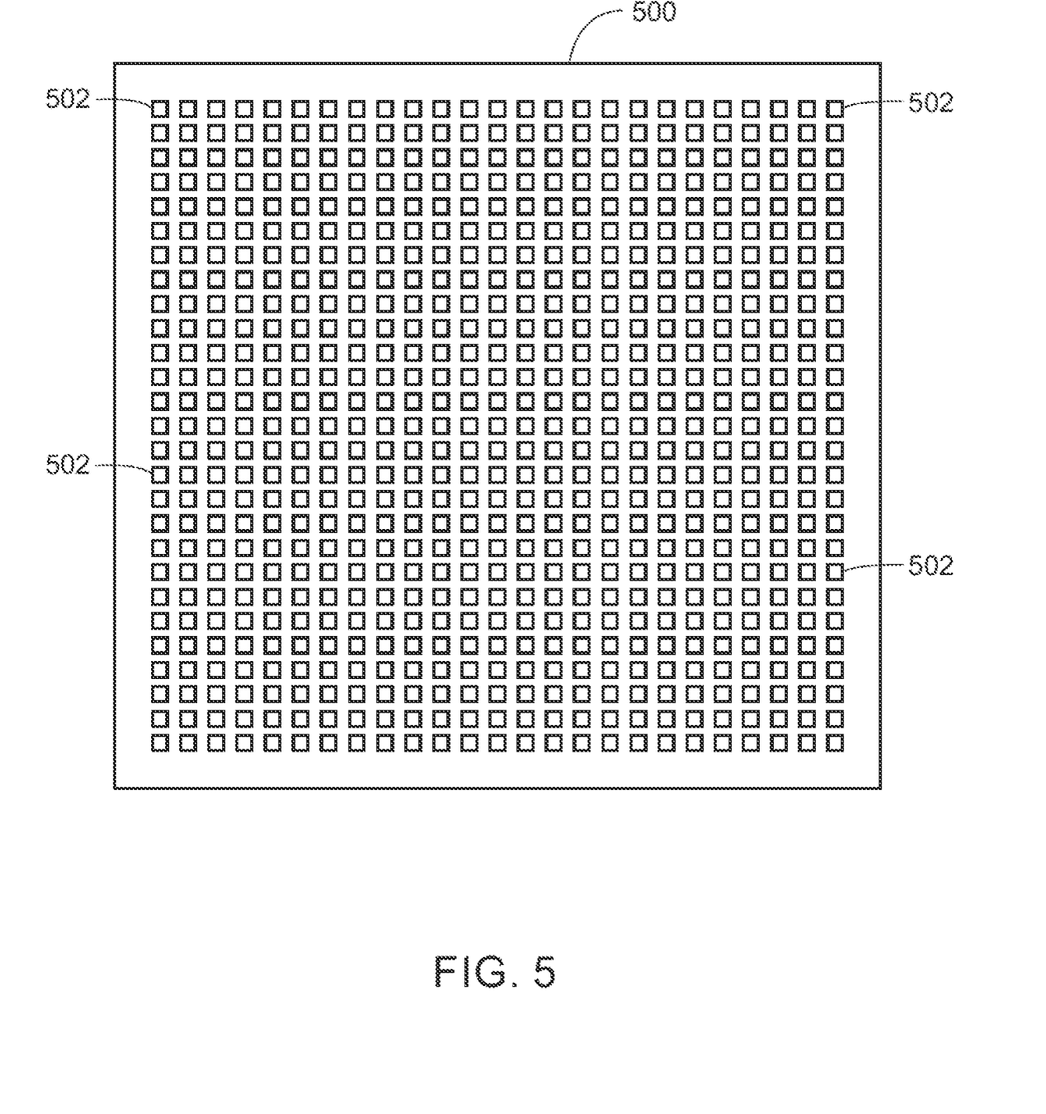
FIG. 5 is a drawing of a mask that can be used to form pyramidal shapes on the substrate.

FIG. 5 is a drawing of a mask 500 that can be used to form pyramidal shapes on the substrate. The mask 500 has square nanoscale openings 502, which, as the clogging 424 (FIG. 4) proceeds, creates sloped nanostructures that have a pyramidal shape.

Figure 6:
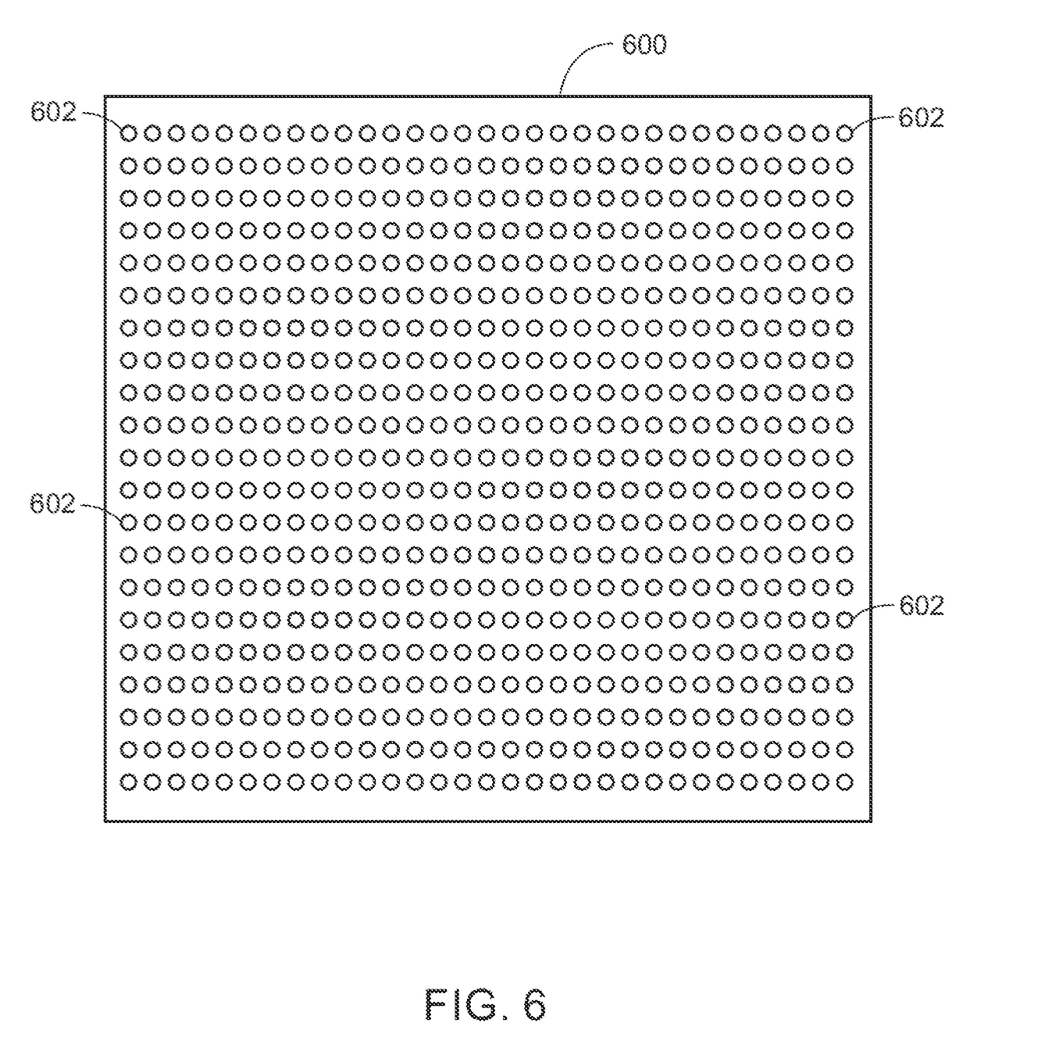
FIG. 6 is a drawing of a mask that can be used to form conical shapes on a substrate.

FIG. 6 is a drawing of a mask 600 that can be used to form conical shapes on a substrate. The mask 600 has round nanoscale openings 602, which, as the clogging 424 (FIG. 4) proceeds, creates sloped nanostructures that have a conical shape.

Figure 7:
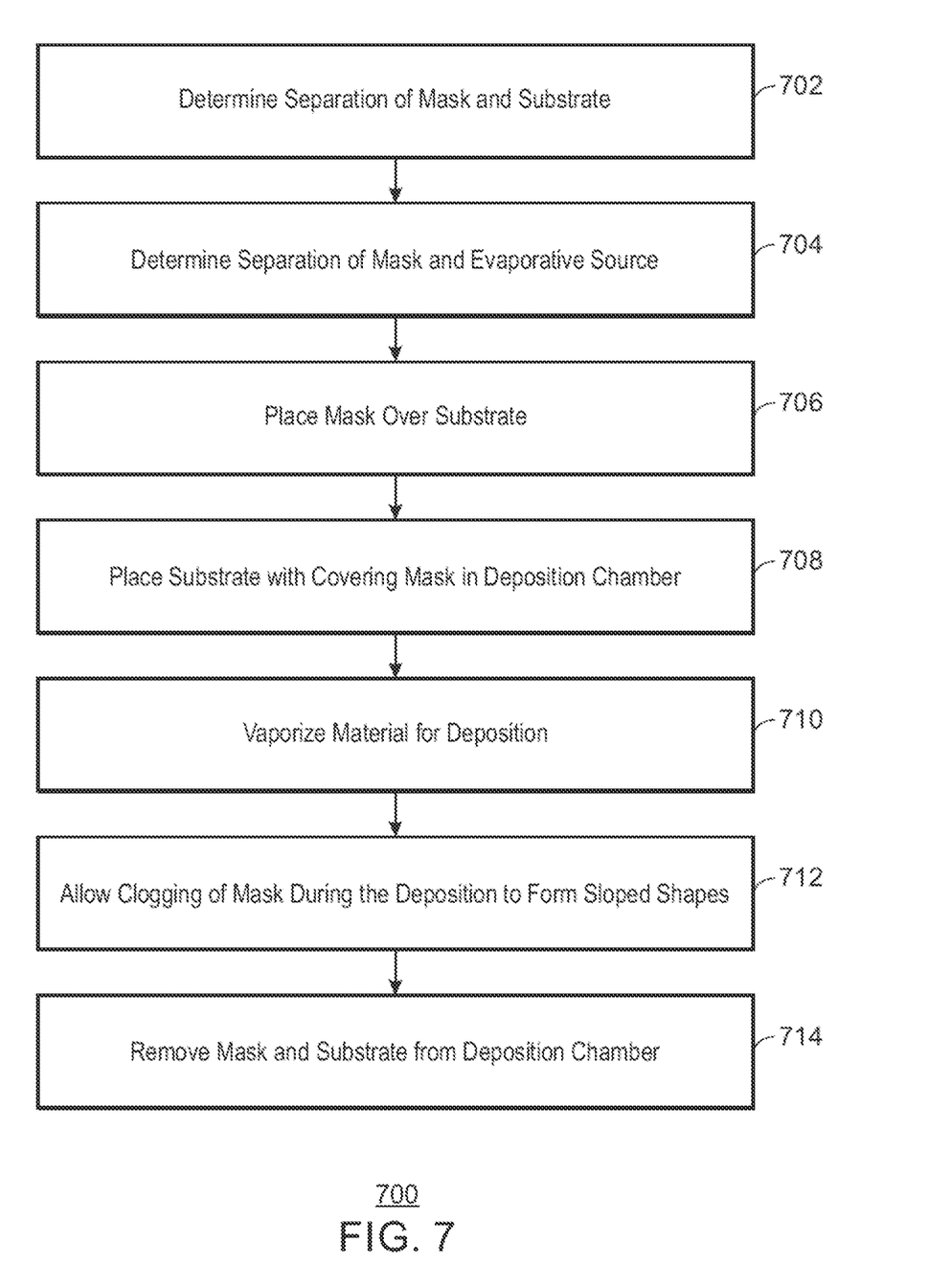
FIG. 7 is a process flow diagram of a method that can be used to form sloped nanostructures on a surface of a substrate.

FIG. 7 is a process flow diagram of a method 700 that can be used to form sloped nanostructures on a surface of a substrate. As described herein, in some embodiments, the sloped nanostructures are formed on the top surface of a solar cell to provide total internal reflections that decrease the amount of light reflecting off the top surface without being absorbed. In these embodiments, the tips face outward from the surface of the solar cell. In another embodiments, the sloped nanostructures are formed behind light sources used in a liquid crystal display panel to increase the amount of light from the light sources that is directed to the panel. In these embodiments, the tips face outward from the light sources to increase total internal reflection towards the liquid crystal panel.

The method begins at block 702, with a determination of the separation of the mask and substrate. As described herein, the separation may be used to control the shape of the sloped nanostructures, including the angles between the walls, the widths of the base, and the overlapped between adjacent sloped nanostructures.

At block 704, a determination is made of the separation of the mask in the evaporative source. As described herein, the separation between the mask and source also provides control over the shape of the sloped nanostructures.

At block 706, the mask is placed over the substrate. As described herein, in some embodiments, the substrate is a solution process solar cell. In some embodiments, the mask is held apart from the substrate by an open frame with a thickness corresponding to the separation between the mask in the substrate.

At block 708, the substrate with the mask is placed in a deposition chamber. The deposition chamber is generally a high vacuum chamber with a heated source providing the vapor for deposition. In some embodiments described herein, the separation between the source and the mask is adjustable, for example, to control the shapes of the sloped nanostructures.

At block 710, the material is vaporized for deposition. This may be performed by heating a filament behind the material, or using other techniques to heed the material to vaporize it in the vacuum of the deposition chamber.

At block 712, clogging of the mask is allowed during the deposition to form the sloped shapes. In contrast to other vapor deposition processes, the deposition may be allowed to proceed for a longer period of time, for example, at a lower rate. The resulting clogging leads to the formation of the sloped nanostructures, as described herein.

At block 714, the mask and substrate are removed from the deposition chamber, for example, after the chamber is allowed to cool and the vacuum is released. In some embodiments, a continuous roll of material is treated in a deposition chamber.

An embodiment disclosed in examples herein provides a method for fabricating sloped nanostructures on a surface of a substrate. The method includes placing a mask over the substrate, placing substrate with the mask in a deposition chamber, vaporizing material for deposition, and allowing clogging of openings in the mask during the deposition to formed sloped shapes.

In an aspect, the method includes selecting a separation of the mask and the substrate to control a slope of the sloped nanostructures. In an aspect, the method includes separating the mask and the substrate by about 1 (micrometer) μm to about 2 μm. in an aspect, the method includes separating the mask and the substrate by about 0.5 μm to about 1 μm.

In an aspect, the method includes forming tips at edges of the openings in the mask to enhance clogging during deposition. In an aspect, the mask includes round openings to form conical nanostructures. In an aspect, the mask includes square and triangular openings to form pyramidal nanostructures. In an aspect, the mask includes slits to form ridges.

In an aspect, the method includes vaporizing silicon nitride to form the sloped nanostructures.

In an aspect, a solar cell is the substrate. In an aspect, a back panel of a liquid crystal display is the substrate.

Another embodiment described in examples herein provides a solar cell. The solar cell includes an antireflective coating including sloped nanostructures formed in a vapor deposition process.

In an aspect, the sloped nanostructures include conical nanostructures. In an aspect, the sloped nanostructures include pyramidal nanostructures. In an aspect, the sloped nanostructures include ridges.

In an aspect, the sloped nanostructures include an angle of less than 45° along a cross-section through a tip of the sloped nanostructures. In an aspect, the sloped nanostructures include an angle of greater than 45° along a cross-section through a tip of the sloped nanostructures.

In an aspect, the sloped nanostructures are disposed at about 500 nm of separation. In an aspect, the sloped nanostructures are between about 200 nm and about 450 nm in height. In an aspect, the sloped nanostructures are between about 550 nm and about 750 nm in height. In an aspect, the sloped nanostructures overlap to form a base layer over the solar cell. In an aspect, the sloped nanostructures include silicon nitride.

Other implementations are also within the scope of the following claims.

What is claimed is:

1. A method for fabricating sloped nanostructures on a surface of a substrate, comprising:
    placing a mask over the substrate, wherein the substrate comprises a top surface of a solar cell;
    placing substrate with the mask in a deposition chamber;
    vaporizing material for deposition, wherein the material is transparent and has a refractive index matching the top surface of the solar cell;
    allowing clogging of openings in the mask during the deposition to formed sloped shapes on the top surface of the solar cell, the sloped shapes overlapping to form a base layer over the solar cell; adjusting the shapes of the sloped nanostructures based, at least in part, on the expected range of angles of light impinging on the solar cell, and adjusting a height of the base layer based, at least in part, on the expected range of angles of light impinging on the solar cell; and
    reducing light reflected from the top surface of the solar cell.

2. The method of claim 1, comprising selecting a separation of the mask and the substrate to control a slope of the sloped nanostructures.

3. The method of claim 2, comprising separating the mask and the substrate by about 1 (micrometer) μm to about 2 μm.

4. The method of claim 2, comprising separating the mask and the substrate by about 0.5 μm to about 1 μm.

5. The method of claim 1, comprising forming tips at edges of the openings in the mask to enhance clogging during deposition.

6. The method of claim 1, wherein the mask comprises round openings to form conical nanostructures.

7. The method of claim 1, wherein the mask comprises square openings to form pyramidal nanostructures.

8. The method of claim 1, wherein the mask comprises slits to form ridges.

9. The method of claim 1, comprising vaporizing silicon nitride to form the sloped nanostructures.

10. The method of claim 1, comprising a solar cell as the substrate.

11. The method of claim 1, comprising a back panel of a liquid crystal display as the substrate.

* * * * *